(12) United States Patent
Hamilton et al.

(10) Patent No.: US 7,796,398 B2
(45) Date of Patent: Sep. 14, 2010

(54) SYSTEM OF COMPONENTS IN AN ELECTRONIC DEVICE

(75) Inventors: Jason Everette Hamilton, Cambridge (CA); Tim Kyowski, Brantford (CA)

(73) Assignee: Research in Motion Limited, Waterloo, Ontario (CA)

( * ) Notice: Subject to any disclaimer, the term of this patent is extended or adjusted under 35 U.S.C. 154(b) by 0 days.

(21) Appl. No.: 12/404,705

(22) Filed: Mar. 16, 2009

(65) Prior Publication Data

US 2009/0175013 A1 Jul. 9, 2009

Related U.S. Application Data

(63) Continuation of application No. 11/369,855, filed on Mar. 8, 2006, now Pat. No. 7,535,726.

(51) Int. Cl.
*H05K 7/00* (2006.01)
(52) U.S. Cl. ........................ 361/760; 361/704
(58) Field of Classification Search ............... 361/760, 361/704
See application file for complete search history.

(56) References Cited

U.S. PATENT DOCUMENTS

| 4,339,628 | A | 7/1982 | Marcantonio et al. |
| 4,887,971 | A | 12/1989 | Reuss et al. |
| 5,304,964 | A | 4/1994 | Di Marco |
| 5,354,951 | A | 10/1994 | Lange, Sr. et al. |
| 5,495,399 | A | 2/1996 | Gore et al. |
| 5,513,996 | A | 5/1996 | Annerino et al. |
| 5,724,234 | A | 3/1998 | Phelps |
| 5,777,856 | A | 7/1998 | Phillips et al. |
| 5,895,884 | A | 4/1999 | Davidson |
| 6,051,779 | A | 4/2000 | Gammon |
| 6,121,546 | A | 9/2000 | Erickson et al. |
| 6,264,480 | B1 | 7/2001 | Nealis et al. |
| 6,274,808 | B1 | 8/2001 | Cercioglu et al. |
| 6,304,458 | B1 | 10/2001 | Mendolia |
| 6,392,603 | B1 | 5/2002 | Kurz et al. |
| 6,603,193 | B2 | 8/2003 | Crane, Jr. et al. |
| 6,628,524 | B1 | 9/2003 | Washino et al. |
| 6,870,091 | B2 | 3/2005 | Seidler |
| 7,169,642 | B2 | 1/2007 | Karnezos |
| 7,247,519 | B2 | 7/2007 | Karnezos et al. |
| 7,361,057 | B1 * | 4/2008 | Bao et al. ............... 439/630 |
| 2004/0065963 | A1 | 4/2004 | Karnezos |
| 2005/0111194 | A1 * | 5/2005 | Sohn ................... 361/704 |

FOREIGN PATENT DOCUMENTS

| EP | 1 513 379 A2 | 3/2005 |
| JP | 2003249789 | 9/2003 |
| JP | 2004022711 | 1/2004 |

\* cited by examiner

*Primary Examiner*—Hung S Bui
*Assistant Examiner*—Andargie M Aychillhum
(74) *Attorney, Agent, or Firm*—McCarthy Tétrault LLP (57) ABSTRACT

The invention provides a system of components in an electronic device. The system comprises: a printed circuit board (PCB); a first component mounted to the PCB; a cap located about the first component, the cap having an arm extending outwardly from a body of the cap; a second component; and a platform for the second component.

16 Claims, 7 Drawing Sheets

SYSTEM OF COMPONENTS IN AN ELECTRONIC DEVICE

RELATED APPLICATION

This application is a continuation application of U.S. Pat. No. 7,535,726 issued on May 19, 2009, which was filed on Mar. 11, 2006 under U.S. patent application Ser. No. 11/369,855.

FIELD OF THE INVENTION

The invention described herein relates to a system of components in a handheld electronic device. In particular, the invention described herein relates to an arrangement for components mounted around a casing, such as an RF shield, mounted on a PCB in the device.

BACKGROUND OF THE INVENTION

A handheld electronic device, such as a personal digital assistant (PDA) or wireless telephone, includes a keyboard/keypad, a display, a speaker, a microphone, printed circuit board (PCB) disposed within a common housing. There is a constant push to reduce the size of such a device. In some form factors, it is necessary to stack components on top of each other. As the devices become smaller, manufacturing techniques become more complicated. Surface mount technologies (SMT) incorporate a wide complement of reduced size components. High-speed pick and place assembling machines can populate a PCB with SMT components very efficiently. However, some components are not compatible with SMT placement machines, because their dimensions or their connection requirements are not compatible with such placement machines. Generally, such incompatible devices are mounted manually. For some components, specialized tools or jigs are often required to be mounted on the PCB during the manufacturing process in order to properly align and affix the components to the board. The use of specialized jigs requires additional toolings to be made. Also, assembling of these devices is slowed because the jig must be aligned with the PCB, then the component must be aligned with the jig and mounted to the PCB and finally, the jig must be removed from the PCB.

There is a need to address deficiencies in the prior art.

BRIEF DESCRIPTION OF THE DRAWINGS

The invention will now be described by way of example only with reference to the accompanying drawings in which.

DETAILED DESCRIPTION OF AN EMBODIMENT

The description which follows and the embodiments described therein are provided by way of illustration of an example or examples of particular embodiments of the principles of the present invention. These examples are provided for the purposes of explanation, and not limitation, of those principles and of the invention. In the description which follows, like parts are marked throughout the specification and the drawings with the same respective reference numerals.

In a first aspect of an embodiment, a system of components in an electronic device is provided. The system comprises: a PCB; a first component mounted to the PCB; a cap located about the first component; a second component; and a platform for the second component. In the system, the platform and the cap may cooperate via alignment features such that the platform may be placed on top of the cap at a predetermined location utilizing the alignment features.

The system may further comprise a connector disposed between the platform and the PCB. The connector may provide electrical connections between the PCB and the platform for the second component.

In the system, the platform may provide connections to offset the second component from a location of corresponding pads on the PCB.

In the system, the cap may comprise at least one arm to position the connector in place. The arm may comprise an upwardly extending tab. The arm may extend outwardly from the body of the cap. The platform may comprise an aperture to receive the tab. The tab may be received in the aperture when the platform is mounted about the cap.

In the system, the arm may have a first side arm extending at an angle from its end; and the second arm may have a second side arm extending at an angle from its end. Also, the side arms may extend towards each other and cooperate with the body to retain the connector in place.

In the system the cap may comprise a second arm to position the connector in place. The second arm may comprise a second upwardly extending tab. The platform may comprise a second aperture to receive the second tab. The second tab may be received in the second aperture when the platform is mounted about the cap.

In the system, the electronic device may be a portable communication device; the second component may be a speaker; and the cap may provide RF shielding for the first component.

In a second aspect, a system of components in an electronic device is provided, comprising: a PCB; a first component mounted to the PCB; a cap located about the first component, having an arm extending outwardly from a body of the cap; a second component; and a platform for the second component. The cap may comprise a second arm to position extending outwardly from the body of the cap.

In a third aspect, a system of components in an electronic device is provided, comprising: a PCB; a first component mounted to the PCB; a cap located about the first component having an arm extending outwardly from a body of the cap; a second component; a platform for the second component; and a connector disposed between the platform and PCB, providing electrical connections between the PCB and the platform.

In a fourth aspect, an electronic device is provided, comprising: a PCB; a first component mounted to the PCB; a cap located about the first component; a second component; and a platform for the second component.

In a fifth aspect, a method of assembling components in an electronic device is provided. The device comprises a PCB, a first component mounted to the PCB, a cap located about the first component, a second component and a platform for the second component. The method comprises: assembling the platform onto the cap without utilizing an external jig and utilizing alignment features provided on the cap and the platform, such that the platform may be placed on top of the cap at a predetermined location about the cap defined by the alignment features.

In the method, the cap may comprise an arm to position the connector in place. The arm may comprise an upwardly extending tab. The platform may comprise an aperture to receive the tab. Also, the tab may be received in the aperture when the platform is mounted about the cap.

In the method, the cap may comprise a second arm to position the connector in place. The second arm may comprise a second upwardly extending tab. The platform may comprise a second aperture to receive the second tab. The second tab may be received in the second aperture when the platform is mounted about the cap.

In the method, the electronic device may be a portable communication device; the second component may be a speaker; and the cap may provide RF shielding for the first component.

In other aspects various combinations of sets and subsets of the above aspects are provided.

Figure 1:
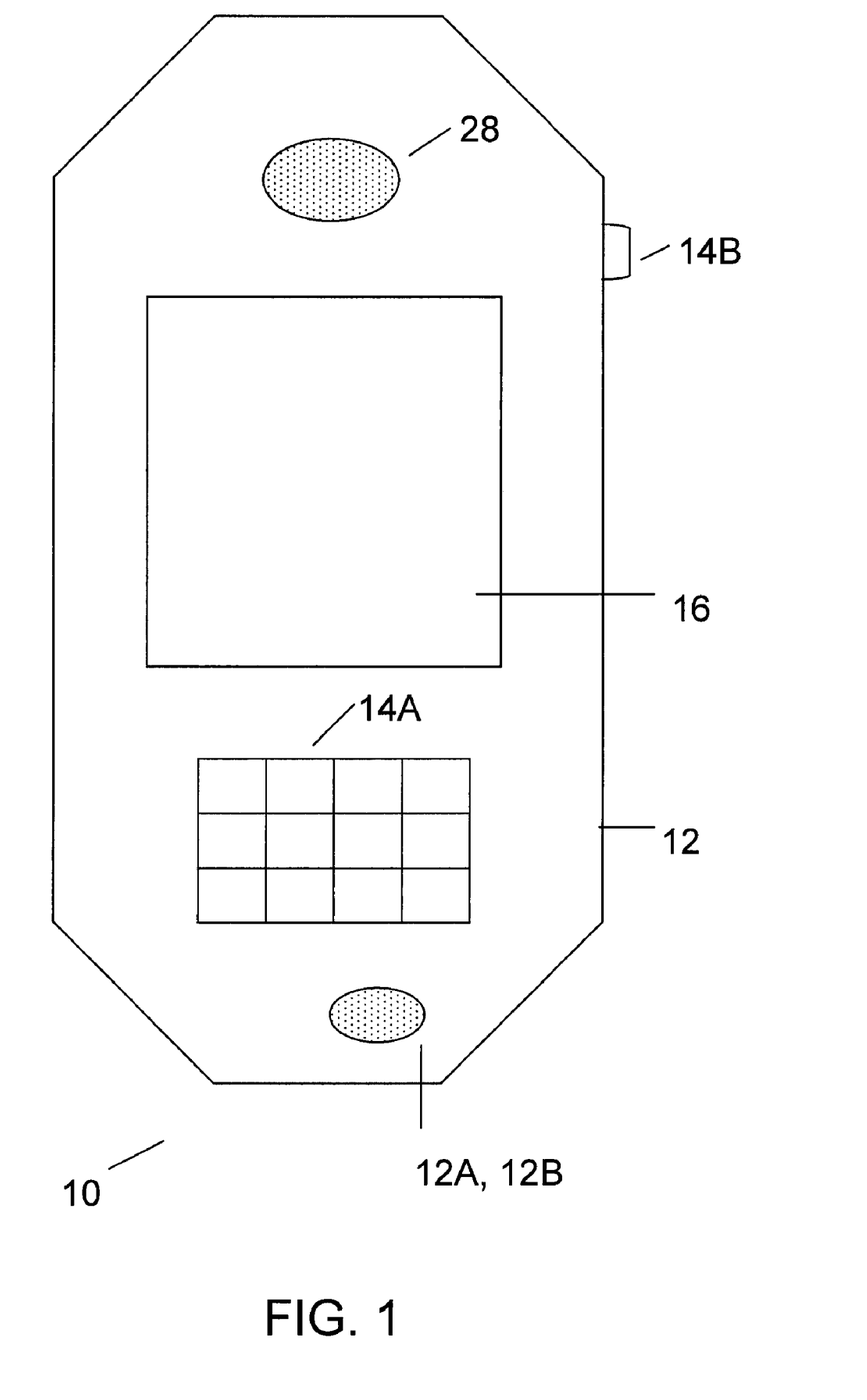
FIG. 1 is a front plan view of schematic of a handheld electronic device assembled through an embodiment of the invention described herein.

FIG. 1 illustrates a handheld mobile communication device 10 and its components, including a housing 12, an input device (e.g. keyboard 14A and/or thumbwheel 14B) and an output device (a display 16), which is preferably a graphic liquid crystal display (LCD), although other types of output devices may alternatively be utilized. Typically, housing 12 is a moulded polycarbonate structure and may be formed via known plastic injection moulding techniques. To assist in assembly of device 10, housing 12 typically comprises two or more pieces which fit together in a fitted arrangement to enclose the internal devices and form an exterior casing for device 10. For example, housing 12 may comprise an upper housing 12A and a lower housing 12B. Physically for device 10, housing 12 may be elongated vertically, or may take on other sizes and shapes (including clamshell housing structures). Speaker 28 and microphone 30 are located within housing 12 and provide audible input and output components for device 10. Openings within housing 12A around each of speaker 28 and microphone 30 allow audible signals to pass between the interior of device 10 and the exterior of device 10.

Figure 2:
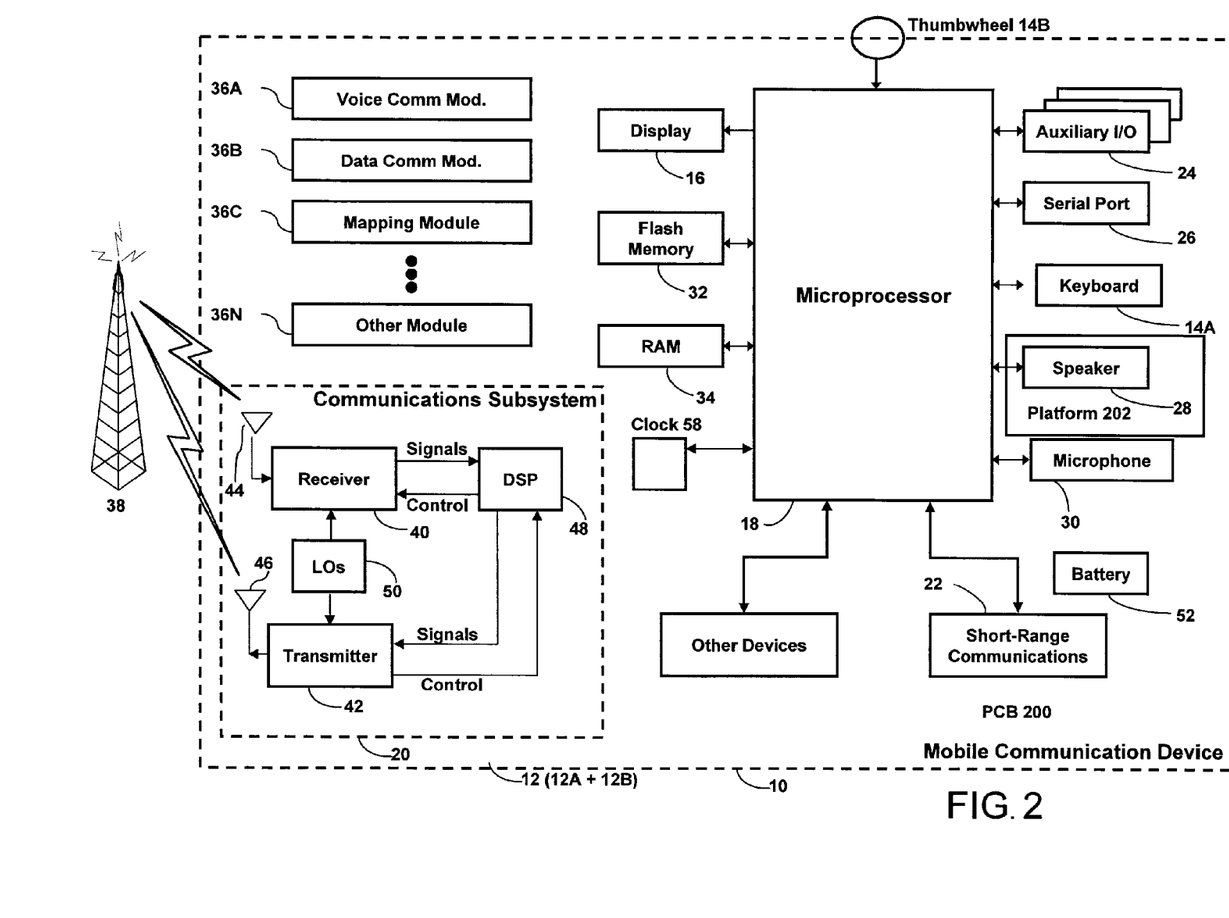
FIG. 2 is a block diagram of the components of the electronic device of FIG. 1, including a speaker assembly relating to an embodiment.

Referring to FIG. 2, components for device 10 are shown. Generally, all components are connected to or mounted on PCB 200. PCB 200 comprises a series of internal conductive tracks that form circuits for the components of device 10. Briefly, a description of selected components of device 10 follows.

First, a processing device (a microprocessor 18) is shown as coupled between keyboard 14A, display 16 and a series of other internal devices to device 10. The microprocessor 18 controls the operation of the display 16, as well as the overall operation of device 10, in response to actuation of keys on the keyboard 14A or thumbwheel 14B by a user. Exemplary microprocessors for microprocessor 18 include Data 950 (trade-mark) series microprocessors and the 6200 series microprocessor, both available from Intel Corporation.

In addition to microprocessor 18, other internal components of device 10 are include: a communication subsystem 20, a short-range communication subsystem 22, a set of auxiliary I/O devices 24, a serial port 26, speaker 28 and microphone 30. Memory for device 10 is provided in flash memory 32 and random access memory (RAM) 34. Internal devices are enclosed within housing 12 and typically are either mounted onto a printed circuit board (PCB), affixed to an interior part of the housing or suspended by some means within housing 12.

Device 10 is preferably a two-way radio frequency (RF) communication device having voice and data communication capabilities. In addition, device 10 preferably has the capability to communicate with other computer systems via the Internet.

Operating system software executed by the microprocessor 18 is preferably stored in a computer readable medium, such as flash memory 32, but may be stored in other types of memory devices, such as read only memory (ROM) or similar storage element. In addition, system software, specific device applications, or parts thereof, may be temporarily loaded into a volatile store, such as RAM 34. Communication signals received by the mobile device may also be stored to RAM 34.

Microprocessor 18, in addition to its operating system functions, enables execution of software applications on device 10. A set of software applications that control basic device operations, such as a voice communication module 36A and a data communication module 36B, may be installed on device 10 during manufacture or downloaded thereafter. Cell mapping module 36C may also be installed on device 10 during manufacture. As well, additional software modules, illustrated as an other software module 36N, which may be, for instance, a personal information manager (PIM) application, may be installed during manufacture or downloaded thereafter into device 10. PIM application is preferably capable of organizing and managing data items, such as e-mail messages, calendar events, voice mail messages, appointments, and task items. PIM application is also preferably capable of sending and receiving data items via a wireless network 38.

Communication functions, including data and voice communications, are performed through communication subsystem 20, and possibly through short-range communication subsystem 22. Communication subsystem 20 includes receiver 40, transmitter 42 and one or more antennae, illustrated as receive antenna 44 and transmit antenna 46. In addition, communication subsystem 20 also includes processing module, such as digital signal processor (DSP) 48 and local oscillators (LOs) 50. The specific design and implementation of communication subsystem 20 is dependent upon the communication network in which device 10 is intended to operate. For example, communication subsystem 20 of device 10 may be designed to operate with the Mobitex (trade-mark), DataTAC (trade-mark) or General Packet Radio Service (GPRS) mobile data communication networks and also designed to operate with any of a variety of voice communication networks, such as Advanced Mobile Phone Service (AMPS), Time Division Multiple Access (TDMA), Code Division Multiple Access (CDMA), Personal Communication Service (PCS), Global System for Mobile Communication (GSM), etc. Other types of data and voice networks, both separate and integrated, may also be utilized with device 10. It will be appreciated that some signals received and transmitted through subsystem 20 may provide interfering signals with other components in device 10, such as microphone 30.

Network access requirements vary depending upon the type of communication system which can communicate with device 10. For example, in the Mobitex (trade-mark) and DataTAC (trade-mark) networks, mobile devices are registered on the network using a unique Personal Identification Number (PIN) associated with each device. In GPRS networks, however, network access is associated with a subscriber or user of a device. A GPRS device therefore requires a subscriber identity module, commonly referred to as a Subscriber Identity Module (SIM) card, in order to operate on a GPRS network.

When required network registration or activation procedures have been completed, device 10 may send and receive communication signals over communication network 38. Signals received from communication network 38 by the receive antenna 44 are routed to receiver 40, which provides for signal amplification, frequency down conversion, filtering, channel selection, etc., and may also provide analog to digital conversion. Analog-to-digital conversion of received signals allows DSP 48 to perform more complex communication functions, such as signal demodulation and decoding. In a similar manner, signals to be transmitted to network 38 are processed (e.g., modulated and encoded) by DSP 48 and are then provided to transmitter 42 for digital to analog conversion, frequency up conversion, filtering, amplification and transmission to communication network 38 (or networks) via the transmit antenna 46.

In addition to processing communication signals, DSP 48 provides for control of receiver 40 and transmitter 42. For example, gains applied to communication signals in receiver 40 and transmitter 42 may be adaptively controlled through automatic gain control algorithms implemented in DSP 48.

In a data communication mode, a received signal, such as a text message or web page download, is processed by the communication subsystem 20 and is input to microprocessor 18. The received signal is then further processed by microprocessor 18 for an output to the display 16, or alternatively to some other auxiliary I/O devices 24. A user may also compose data items, such as e-mail messages, using keyboard (keypad) 14A, thumbwheel 14B and/or some other auxiliary I/O device 24, such as a touchpad, a rocker switch or some other type of input device. The composed data items may then be transmitted over communication network 38 via communication subsystem 20.

In a voice communication mode, overall operation of device 10 is substantially similar to the data communication mode, except that received signals are output to speaker 28, and received audio signals are provided to microphone 30 for further conversion into an electrical signal and further processing by device 10. Microphone 30 is preferably a silicon-based transducer which can be mounted to PCB 200. Speaker 28, as will be described in further detail below, is mounted on speaker platform 202.

Short-range communication subsystem 22 enables communication between device 10 and other proximate systems or devices, which need not necessarily be similar devices. For example, the short-range communication subsystem may include an infrared device and associated circuits and components, or a Bluetooth (trade-mark) communication module to provide for communication with similarly-enabled systems and devices.

Powering the entire electronics of the mobile handheld communication device is power source 52. Preferably, the power source 52 includes one or more batteries. More preferably, the power source 52 is a single battery pack, especially a rechargeable battery pack.

Figure 3:
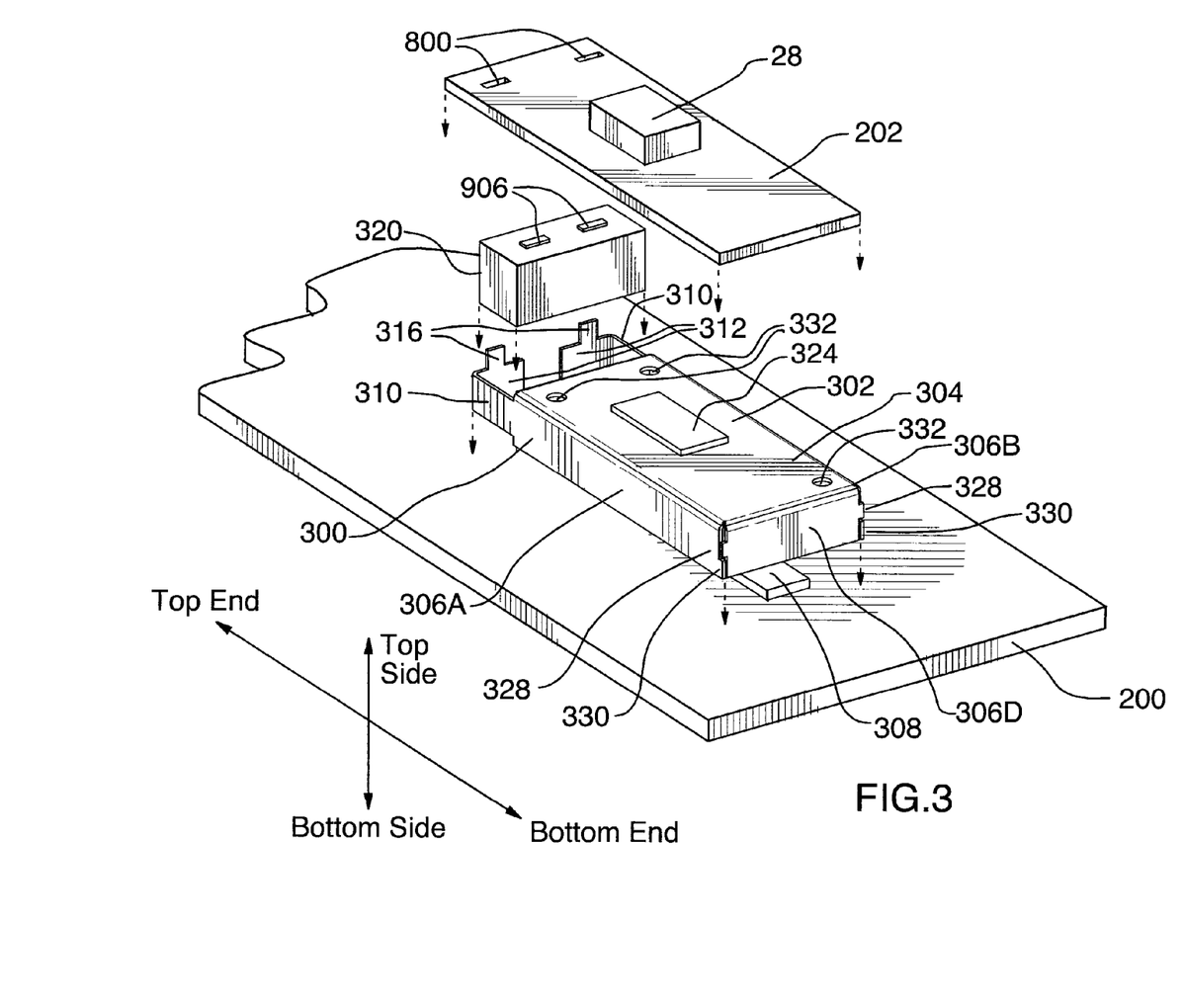
FIG. 3 is an exploded upper perspective view of a schematic of selected components of the device of FIG. 1, including a printed circuit board (PCB), a speaker, a speaker platform, a RF shield and a speaker connector.

FIG. 3 depicts a typical layout of components of device 10. For the purposes of illustration, references to top side, bottom side, left and right sides, top and bottom ends are provided using the orientation rose of PCB 200 as shown in FIG. 3. Therein, the top side of the PCB is the front facing side having display 16 mounted thereto. The top end of the PCB is the end where the display is mounted. These references provide relative positional references for components for convenience only and are not meant to be limiting, unless otherwise noted.

A notable feature of an embodiment allows one or more components for device 10 to be mounted on top of one or more components, instead of the typical flat arrangement of components on PCB 200. As a further feature, when one component is mounted on top of another component, features are provided which facilitate the mounting and aligning of the top component on the bottom component, preferably without using a jig or a tool to align the top component on the bottom one. In one embodiment, the notable features are provided through speaker platform 202 which is mounted on top of RF shield 300 on PCB 200. Further detail is provided on these features.

As noted before, PCB 200 provides a substrate for components of device 10. Many components are SMT components and are mounted via a SMT process. Other through hole components may be mounted through pick-and-place through hole machines. Still other components may be manually placed on PCB 200. Some of these components may require RF shielding because they are sensitive to external RF noise. Microphone 30 may be such a component. Other components may emit RF signals which need to be shielded from other components. In other aspects, other shields may be used, e.g. light shields, noise shields, heat shields or any other type of shield known in the art. To assist with a RF shielding, RF shield 300 is provided. In other embodiments, other shields may be provided. Further in other embodiments, shielding properties may be foregone.

RF shield 300 is a stamped metal piece shaped to define a cap 302. Cap 302 has a top 304 and sides 306 to form a body. The volume defined under the sides 306 and top 304 define a perimeter of cap 302, with top 304 providing the top of cap 302. In the embodiment, there are four sides 306 for cap 302. When a specific side 302 is being referenced, it is noted with a suffix A, B, C or D as appropriate. When shield 300 is mounted on PCB 200, shield 300 is preferably fitted and shaped to sit on top of and fully enclose component 308 which has been previously mounted to PCB 200. Component 308 may be a surface mount component, a through hole component or a manually mounted component. For performance or sensitivity reasons, component 308 may benefit from being isolated from other components outside the region where shield 300 is mounted. When shield 300 is mounted on PCB 200, no significant air gaps are defined underneath top 304 and between sides 306 and PCB 200. In one embodiment, side 306D has small extensions 328 on its lateral ends which interlock with corresponding extensions 330 on the lateral ends of each side 306A and 306B. As such, RF shield provides proper RF shielding to component 308 and other components contained underneath cap 302. Three vents 332 are provided on top 304. The vents provide an alignment target for pick-and-place machines for mounting shield 300 on PCB 200.

RF shield 300 may contact with a ground pad (not shown) on PCB 200. The ground pad may have an internal connection to a ground plane in PCB 200. This contact provides a grounding path for shield 300.

Speaker platform 202 is preferably mounted on top of shield 300. Platform 202 provides a substrate for speaker 28 and contains electrical connection tracks therein. It is also preferably a PCB. In order to provide electrical contacts between PCB 200 and platform 202, connector 320 which preferably provides a physical connection between connection pads 318 on PCB 200 and connection pads 322 on platform 202. Further detail on platform 202 is provided later.

In order to provide a securing system for connector 320, preferably RF shield 300 has arms 310 extending outwardly from opposing sides 306A and 306B at the end of side 306C. At the end of each arm 310, a 90° turn inward is provided to produce side arms 312, which are oriented to be generally parallel to side 306C. There is a gap between the ends of arms 312. Along a top edge 314 of each side arm 312 is an upwardly protruding tab 316 located at approximately the mid-way point along each side arm 312. In other embodiments, the side arms 312 can be turned inward at other angles. In other embodiments, the side arms 312 may be connected to each other, forming a part of a loop. The loop is completed by arms 310 and side 306C.

Side 306C, arms 310 and side arms 312 define a perimeter which rests over a series of connectors 318 on the top surface of PCB 200. The perimeter is shaped to co-operate with the body of a connector 320 so that connector 320 fits snugly within the perimeter and is held by a friction fit by the friction interaction of arms 310 and 312 and side 306C and its body.

In still other embodiments, shield 300 may have other shapes, sizes, dimensions, features or extensions which operate to align and/or hold connector 320 in place. In still other embodiments, other securing systems may be provided using shapes and features which are separate from shield 300.

Figure 4:
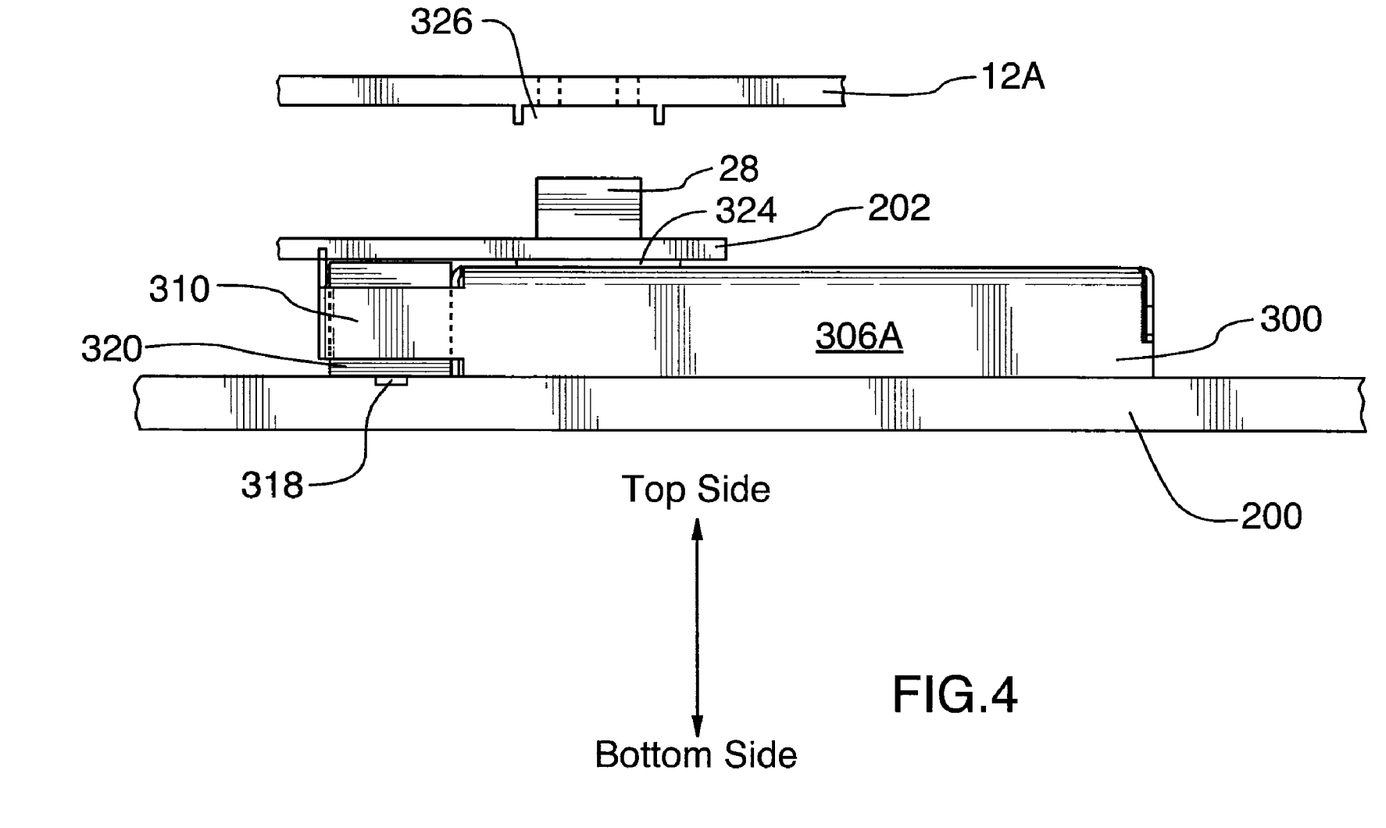
FIG. 4 is an exploded side view of a schematic of selected components of the device of FIGS. 1 and 3, including the PCB, speaker, RF shield and speaker connector.
Figure 5:
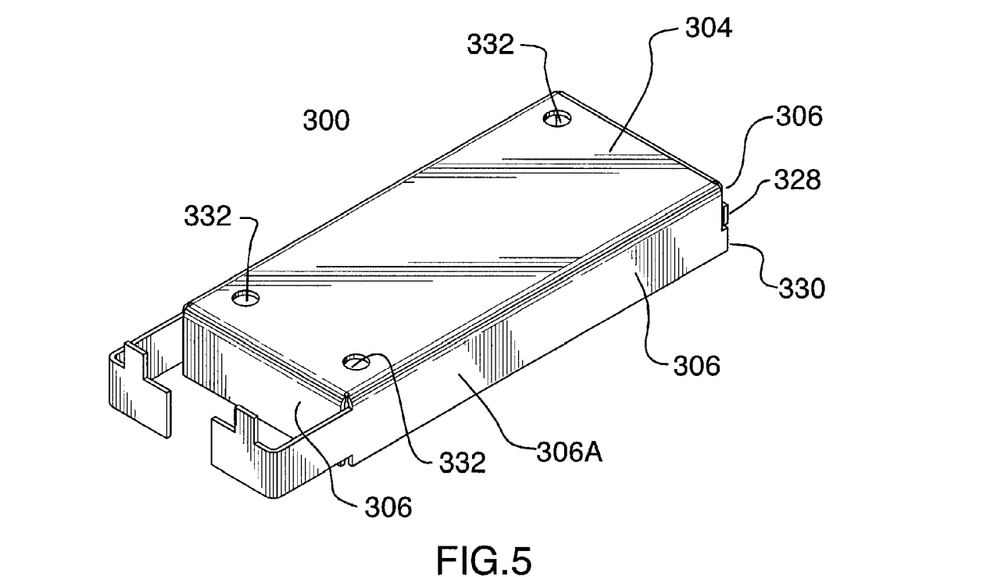
FIG. 5 is upper perspective view of a schematic of the RF shield of FIG. 3.
Figure 6:
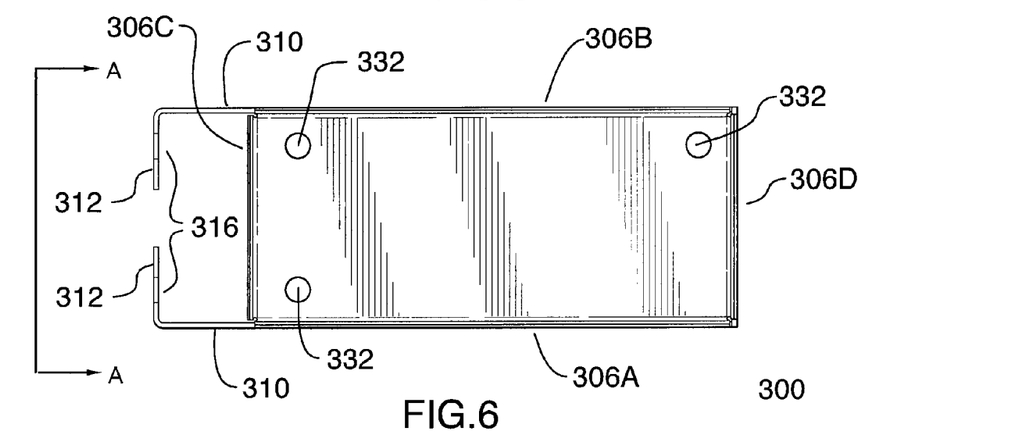
FIG. 6 is top view of a schematic of the RF shield of FIG. 3.
Figure 7:
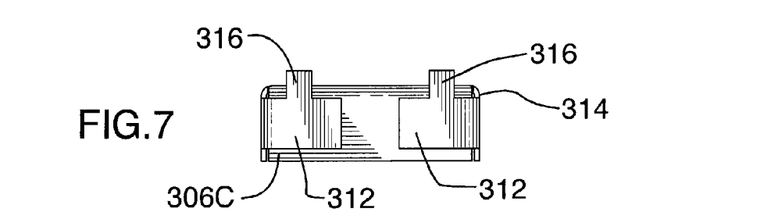
FIG. 7 is a side view of a schematic of the RF shield of FIG. 6 along the lines A-A.
Figure 9:
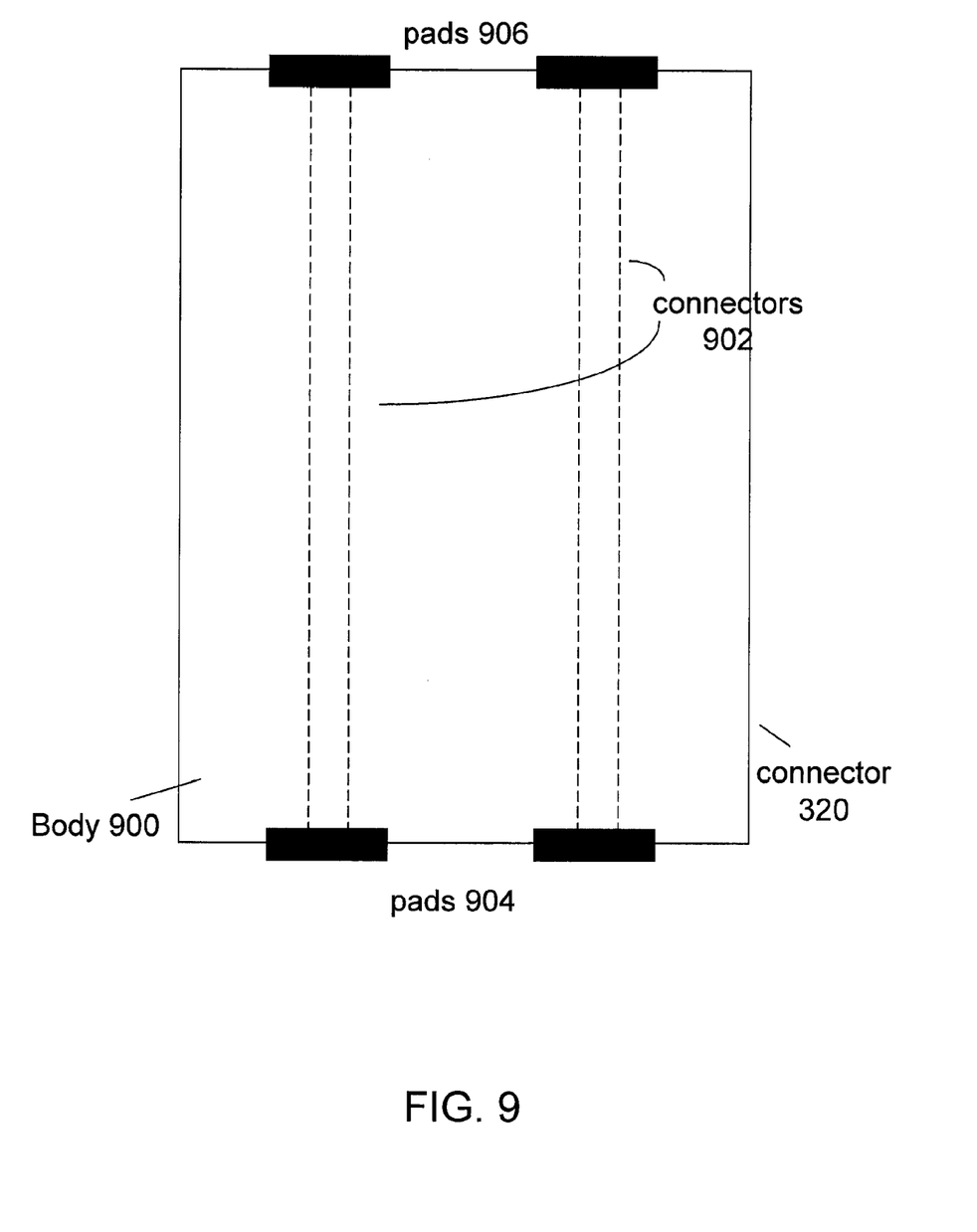
FIG. 9 is a side view of a schematic of the speaker connector of FIG. 3.

Referring to FIGS. 3, 4 and 9, connector 320 has an oblong body 900 which has internal electrical connections 902 therein. On the bottom surface of body 900, electrical pads 904 are provided. On the top surface of body 900 electrical pads 906 are provided. Internal connections 902 inside body 900 provide electrical continuity between pads 904 and 906. When body 900 is fitted snugly into the perimeter defined by arms 310, 312 and side 306C, pads 904 make contact with pads 318 on PCB 200. Preferably, the height of body 900 is made such that the top end of body 900 extends slightly above the top edge of shield 300. Connector 320 is preferably made from a compressible material, and may be implemented as a zebra strip or a polystrip having embedded connectors therein. When speaker platform 202 is subsequently mounted in place on top of shield 300, connector 320 compresses slightly and pads 906 on connector 320 make contact with pads 322 on the bottom side of platform 202. Compression of connector 320 aids in providing a sound electrical contact between pads 904 and 906 and their corresponding pads on PCB 200 and platform 202 respectively.

Connector 320 is typically inserted by hand during the assembly process for device 10. In other embodiments, other components may be placed in the perimeter, per design requirements made for the particular system.

In other embodiments, other shapes and forms for connector 320 may be used. For example, another connector may be a segment of ribbon cable.

Figure 8:
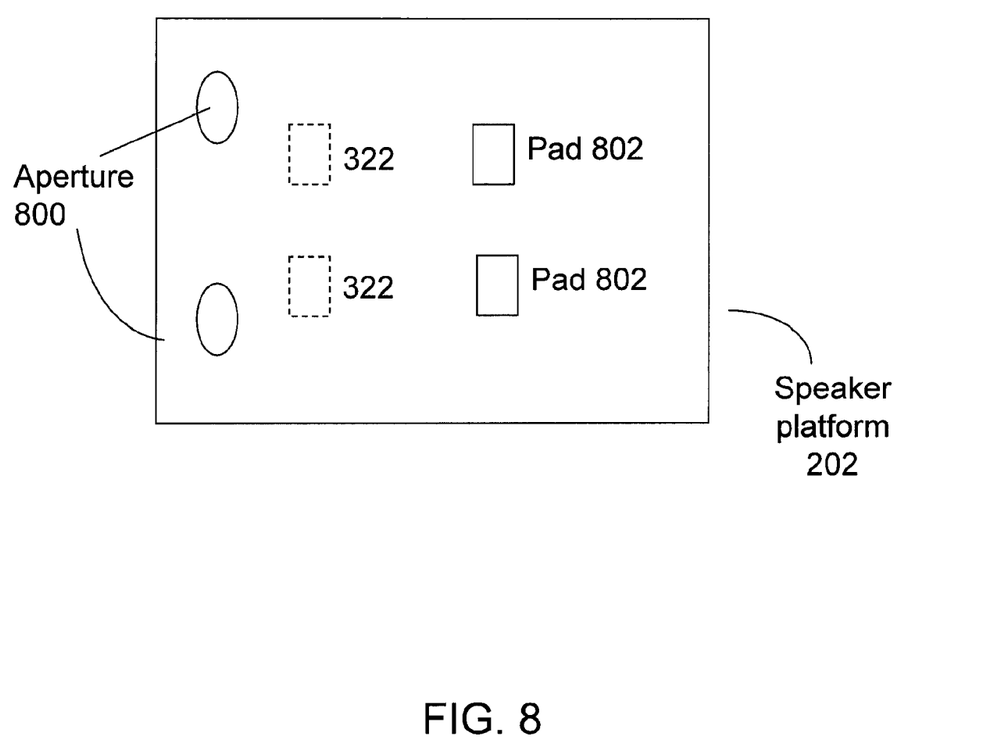
FIG. 8 is top view of a schematic of the speaker platform of FIG. 3.

Referring to FIGS. 3, 4 and 8, after connector 320 is inserted in place about shield 300, speaker platform 202 is mounted to the top of RF shield 300. Apertures 800 in platform 202 are sized and spaced to align with and receive tabs 316. As such in an assembly process platform 202 can quickly mounted to shield 300 by aligning apertures 800 with tabs 316 and then resting platform 202 on top of shield 300. To fix platform 202 to shield 300, a strip of double-sided adhesive tape 324 may be first located on top 304 of shield 300. The location of apertures 800 are arranged such that when tabs 316 are inserted there through, the expected position of connector 320 with its top pads 906 align with pads 322 on the bottom side of platform 202. Assembly and alignment of all components is preferably accomplished without additional jigs or tools needed.

It will be appreciated that the interaction between tabs 316 on shield 300 and apertures 800 on platform 202 provide an alignment system for mounting platform 202 about shield 300. In other embodiments, other alignment systems can be provided. Generally, an alignment system has one feature on either the shield or the platform which positively mates with a corresponding feature on the corresponding platform or shield. The features are complementary to each other. For example one feature may be a positive feature, such as protrusion, tab, flange or the like. The complementary feature may be a negative feature, such as an aperture, void, opening, notch of the like. It will be further appreciated that the position, size, shape, number and locations of tabs and apertures between shield 300 and platform 202 may be changed, moved and reconfigured as needed. For example, another alignment system may utilize a flange interacting with a notch. The notch may be located on the shield and the flange on the platform or vice versa. Additionally, the location of flanges and notches may alternate between the shield and the platform. Further, in other embodiments, alignment features may be provided from the PCB 200 or through other one or more other components mounted on PCB 200.

As such, an electrical connection is present from pads 318 to pads 322. For the embodiment, the circuit associated with speaker 28 is carried through the two connections represented by pads 318. In order to complete the circuit, interior tracks within platform 202 provide a connection to between pads 322 on the lower surface of platform 202 to pads 802 on the upper surface of platform 202. The location of pads 802 is preferably provided such that they align with the connections on the bottom of speaker 28. Also the location of pads 802 may be offset from being directly over pads 318 on PCB 200. As such, platform 202 may also be used to locate speaker 28 in a location which is immediately above another component, such as a component contained within cap 302. Speaker 28 may simply sit on platform 202 in place and an electrical circuit may be completed to pads 318. Some double-sided adhesive tape may be used to tack speaker 28 to platform 202. Housing 12A may have a shaped area 326 which can receive the top portion of speaker 28 and keep it in place. Some more double-sided adhesive tape may be used to tack speaker 28 to housing 12A. When all relevant components are mounted on PCB 200, housings 12A and 12B may be mated together and speaker 28 is received in shaped area 326.

It will be appreciated in other embodiments that other components may be mounted on top of shield 300. Alternatively, no components may need to be mounted on platform 202 on top of shield 300. Further still, in other embodiments, shield 300 may be replaced with a different structure that allows components to be located underneath and above it.

Further still, although the embodiments have been described in terms of a speaker with a connector being connected to the PCB and a connection system therefor, in other embodiments, other electronic devices, not necessarily incorporating a speaker, but having a connection from a PCB to a location above the PCB may be used. Such electronic devices may include a populated daughterboard, a microprocessor, memory devices and electromechanical devices, such as relays.

The present invention is defined by the claims appended hereto, with the foregoing description being merely illustrative of a preferred embodiment of the invention. Those of ordinary skill may envisage certain modifications to the foregoing embodiments which, although not explicitly discussed herein, do not depart from the scope of the invention, as defined by the appended claims.

The invention claimed is:

1. A system of components in an electronic device, comprising:
   a printed circuit board (PCB);
   a cap located about said first component, the cap having a first and a second arm extending outwardly from a body of the cap;
   a first component;
   a platform for mounting on the cap and providing a top surface for mounting the first component; and
   a connector disposed between the platform and the PCB and located against the cap and the arm, the connector providing electrical connections between the PCB and the platform for the first component.

2. The system of components as claimed in claim 1, wherein the platform provides connections to offset the first component from a location of pads on the PCB.

3. The system of components as claimed in claim 1, wherein:
   the first arm has a first side arm extending at an angle at an end of the first arm; and
   the second arm has a second side arm extending at an angle at an end of the second arm.

4. The system of components as claimed in claim 1, wherein:
   the electronic device is a portable communication device;
   the first component is a speaker; and
   the cap provides radio frequency shielding for a second component mounted to the PCB.

5. The system of components as claimed in claim 1, wherein the cap and the first arm are arranged to position the connector in place.

6. The system of components as claimed in claim 1, wherein the connector is locatable between the first and the second arm to be held therebetween with a friction fit.

7. The system of components as claimed in claim 1, wherein:
   the first arm has a first tab located extending upwardly therefrom; and
   the platform has a first aperture to receive the first tab.

8. The system of components as claimed in claim 3, wherein the first and second side arms are connected to each other, forming a part of a loop.

9. The system of components as claimed in claim 6, wherein the first and second side arms extend towards each other and cooperate with the body to retain the connector in place.

10. A system of components in an electronic device, comprising:
    a printed circuit board (PCB); a first component mounted to said PCB; a cap located about the first component, the cap having a first arm and a second arm extending outwardly from a body of the cap; a second component; a platform for mounting on said cap and providing a top surface for mounting the second component; and a connector disposed between the platform and the PCB and located against said cap by the first arm, the connector providing electrical connections between the PCB and the platform for the second component.

11. The system of components as claimed in claim 10, wherein the platform provides connections to offset the second component from a location of pads on the PCB.

12. The system of components as claimed in claim 11, wherein:
    the electronic device is a portable communication device;
    the second component is a speaker; and
    the cap provides RF shielding for the first component.

13. An electronic device, comprising: a printed circuit board (PCB); a first component mounted to the PCB; a cap located about the first component, the cap having a first arm extending outwardly from a body of the cap; and a second arm extending outwardly from the body of the cap; a second component; and a platform for mounting on the cap and providing a top surface for mounting the second component; and a connector disposed between the platform and the PCB and located against the cap and the first arm, the connector providing electrical connections between the PCB and the platform for the second component.

14. The electronic device as claimed in claim 13, wherein:
    the electronic device is a portable communication device;
    the second component is a speaker; and
    the cap provides radio frequency shielding for the first component.

15. The electronic device as claimed in claim 13, wherein the platform provides connections to offset the second component from a location of pads on the PCB.

16. The electronic device as claimed in claim 13, wherein:
    the arm has a first tab located extending upwardly therefrom; and
    the platform has a first aperture to receive the first tab.

* * * * *